United States Patent [19]

Yamamoto et al.

[11] Patent Number: 4,749,974
[45] Date of Patent: Jun. 7, 1988

[54] DOUBLE-TUNED CIRCUIT

[75] Inventors: Masaki Yamamoto, Haramachi; Mineo Koyama, Soma, both of Japan

[73] Assignee: Alps Electric Co., Ltd., Japan

[21] Appl. No.: 5,930

[22] Filed: Jan. 22, 1987

[30] Foreign Application Priority Data

Mar. 25, 1986 [JP] Japan .............................. 61-44580[U]

[51] Int. Cl.[4] .............................................. H03J 5/24
[52] U.S. Cl. .......................................... 334/56; 334/15; 334/89
[58] Field of Search ......................... 334/15, 47, 56–58, 334/89; 455/191

[56] References Cited

U.S. PATENT DOCUMENTS

| | | | |
|---|---|---|---|
| 2,953,756 | 9/1960 | Lafferty | 333/178 |
| 3,566,277 | 2/1971 | Von Fange et al. | 334/56 X |
| 3,611,154 | 10/1971 | Kupfer | 334/56 X |
| 3,903,487 | 9/1975 | Maier | 455/191 X |
| 4,291,290 | 9/1981 | Ijichi et al. | 334/47 X |

FOREIGN PATENT DOCUMENTS 185231 11/1982 Japan .
1225171 3/1971 United Kingdom .

Primary Examiner—Paul Gensler
Attorney, Agent, or Firm—Guy W. Shoup

[57] ABSTRACT

A double-tuned circuit is provided of the type comprising a primary tuning circuit including first and second resonance coils connected in series and a first switching diode interposed between the connection point of the first and second resonance coils and the ground, and a secondary tuning circuit including third and fourth resonance coils connected in series and inductive-coupled with the first and second resonance coils, respectively, and a second switching diode interposed between the connection point of the third and fourth resonance coils and the ground, wherein band switching is preformed by turning on/off both the first and second switching diodes, which is characterized in that a bias voltage for turning on the first and second switching diodes is supplied to one of the switching diodes and through a conductive wire inductive-coupled with a sintered magnetic material to the other of the switching diodes, whereby an enlargement of the bandwidth and degradation of the flatness of the passband characteristic can be suppressed even with an increase of a receive channel frequency.

2 Claims, 3 Drawing Sheets (A) 100MHz  (B) 200MHz  (C) 300MHz (A) 100MHz  (B) 200MHz  (C) 300MHz

DOUBLE-TUNED CIRCUIT

BACKGROUND OF THE INVENTION

1. Field of the Invention

This invention relates to a double-tuned circuit and, more particularly, to improvements of the bandwidth and the flatness of the passband characteristic in high receive channels of the highband.

2. Description of the Prior Art

In television tuners, double-tuned circuits having a bandwidth necessary for a television signal and a good selectivity are used to select receive channels and suppress unnecessary disturbance waves.

FIG. 5 is a circuit diagram of an example of conventional double-tuned circuits. In FIG. 5, an input end 2 of a double-tuned circuit 1 is grounded through a dc-blocking capacitor 3 and a variable-capacitance diode 4 in series and through first, second and fifth resonance coils 5, 6 and 7 and a dc-blocking capacitor 8 also in series. The connection point of the first and second resonance coils 5 and 6 is grounded through a first switching diode 9 and a dc-blocking capacitor 10 in series. An output end 11 of the double-tuned circuit 1 is grounded through a dc-blocking capacitor 12 and a variable-capacitance diode 13 in series and is connected to the connection point of the second and fifth resonance coils 6 and 7 through third and fourth resonance coils 14 and 15 in series. The connection point of the third and fourth resonance coils 14 and 15 is grounded through a second switching diode 16 and a dc-blocking capacitor 17 in series. Further, the connection points of the first and second switching diodes 9 and 16 and the dc-blocking capacitors 10 and 17 are connected together through, for example, a printed pattern and to a highband switching voltage terminal 19 through a resistor 18. Furthermore, the connection points of the dc-blocking capacitors 3 and 12 and the variable-capacitance diodes 4 and 13 are connected to a tuning voltage terminal 22 through resistors 20 and 21, respectively. In addition, the connection point of the fifth resonance coil 7 and the dc-blocking capacitor 8 is connected to a lowband switching voltage terminal 24 through a resistor 23. Of course, the first and third resonance coils 5 and 14, as well as the second and fourth resonance coils 6 and 15, are disposed so as to effect inductive-coupling therebetween.

In the foregoing configuration, as a positive voltage is applied to the lowband switching voltage terminal 24 and the highband switching voltage terminal 19 is grounded, both the first and second switching diodes 9 and 16 are reverse-biased to be turned off. As a result, a primary tuning circuit of the lowband is formed by the first, second and fifth resonance coils 5, 6 and 7, variable-capacitance diode 4, and dc-blocking capacitors 3 and 8, whereas a secondary tuning circuit of the lowband is formed by the third, fourth and fifth resonance coils 14, 15 and 7, variable-capacitance diode 13, and dc-blocking capacitors 8 and 12. On the contrary, as a positive voltage is applied to the highband switching voltage terminal 19 and the lowband switching voltage terminal 24 is grounded, both the first and second switching diodes 9 and 16 are forward-biased to be turned on. As a result, a primary tuning circuit of the high-band is formed by the first resonance coil 5, variable-capacitance diode 4, and dc-blocking capacitors 3 and 10, whereas a secondary tuning circuit of the highband is formed by the third resonance coil 14, variable-capacitance diode 13, and dc-blocking capacitors 12 and 17. Accordingly, by regulating a tuning voltage being applied to the tuning voltage terminal 22, the primary and secondary tuning circuits of the lowband/highband can be adjusted to a receive channel.

In the foregoing double-tuned circuit 1 shown in FIG. 5, in order to make high the Q (quality factor) of the primary and secondary tuning circuits at the time of reception of the highband, the connection point of the variable-capacitance diodes 4 and 13 is disposed at the same point as that of the connection point of the dc-blocking capacitors 10 and 17 to shorten the connection path. However, owing to a limitation in layout of parts th first and second switching diodes 9 and 16 are disposed in spaced relation to each other, thus, a printed pattern for connecting together the anodes of these diodes becomes long.

Consequently, at the time of reception of the highband, as shown in the equivalent circuit diagram of FIG. 6, between the first and third resonance coils 5 and 14 is interposed an inductance component 25 of the printed pattern for connection of them. Further, a stray capacity 26 pertinent to a print circuit board etc. is created between the first and third resonance coils 5 and 14.

The bandwidth of the double-tuned circuit 1 varies depending upon the degree of coupling between the primary and secondary tuning circuits, and this degree of coupling increases due to the inductance component 25 of the printed pattern with an increase of the receive channel frequency. Therefore, as shown in FIG. 7, the bandwidth, for example, of 6 MHz at the receive channel being 100 MHz, changes to 15 MHz at 200 MHz, or to 25 MHz at 300 MHz. In this way, the bandwidth enlarges unnecessarily to thereby pass unwanted signals falling within an enlarged bandwidth to a succeeding stage. Further, the Q of the primary and secondary tuning circuits increases with an increase of the receive channel frequency to thereby degrade the flatness of the passband characteristic. Accordingly, the conventional double-tuned circuit 1 has the problem that the performance of reception is degraded with an increase of the receive channel frequency.

SUMMARY OF THE INVENTION

It is an object of the present invention to solve the foregoing problem of the conventional double-tuned circuit, thus to provide a double-tuned circuit having a uniform bandwidth and a uniform flatness of the passband characteristic irrespective of the frequency or number of the receive channel.

To achieve the foregoing object, the present invention provides a double-tuned circuit of the type comprising a primary tuning circuit including first and second resonance coils connected in series and a first switching diode interposed between the connection point of the first and second resonance coils and the ground, and a secondary tuning circuit including third and fourth resonance coils connected in series and inductive-coupled with the first and second resonance coils, respectively, and a second switching diode interposed between the connection point of the third and fourth resonance coils and the ground, wherein band switching is performed by turning on/off both the first and second switching diodes, which is characterized in that a bias voltage for turning on the first and second switching diodes is applied to one of the switching diodes and through a conductive wire inductive-coupled with a sintered magnetic material to the other of the switching diodes.

According to the foregoing configuration, since the bias voltage for turning on both the first and second switching diodes included in the primary and secondary tuning circuits is applied to one of the switching diodes (without modification) and through the conductive wire inductive-coupled with the sintered magnetic material to the other of the switching diodes, the resistance component of the sintered magnetic material increases with an increase of the receive channel frequency, and this increasing resistance component is interposed between the first and second switching diodes. Thus, this interposition acts so as to lower the degree of coupling between the primary and secondary tuning circuits, whereby an increase of the degree of coupling owing to the inductive component of the conductive wire can be compensated, and both an enlargement of the bandwidth and degradation of the flatness of the passband characteristic which would be caused with an increase of the receive channel frequency can be suppressed.

DESCRIPTION OF THE PREFERRED EMBODIMENT

Figure 1:
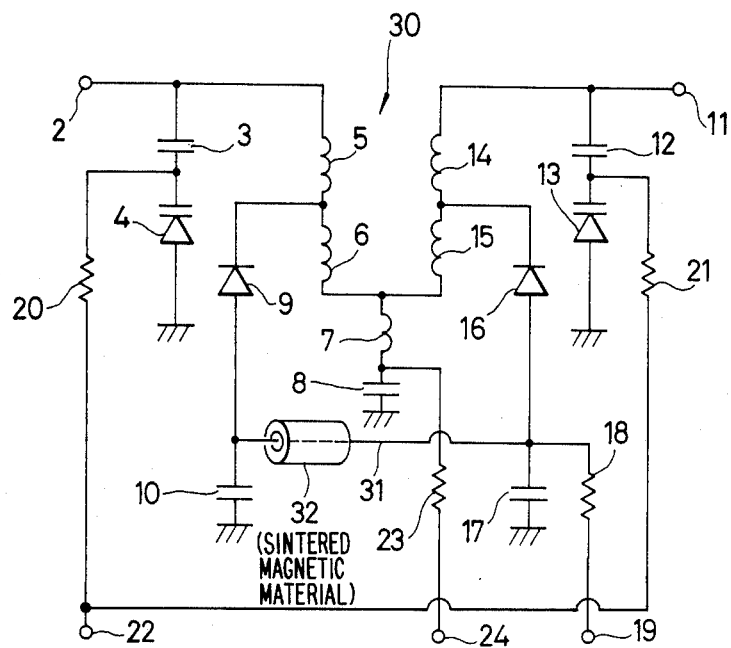
FIG. 1 is a circuit diagram of an embodiment of a double-tuned circuit according to the present invention.
Figure 2:
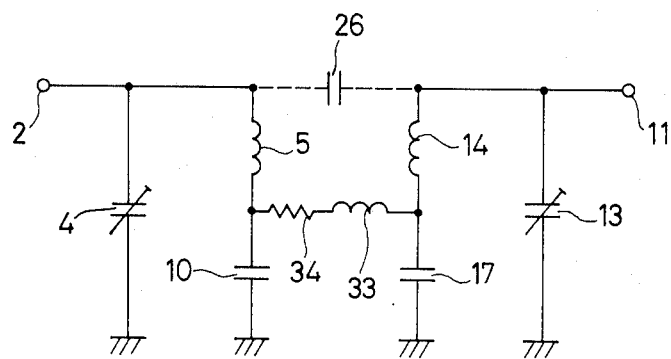
FIG. 2 is an equivalent circuit diagram corresponding to FIG. 1 at the time of reception of the highband.

An embodiment of the present invention will now be described with reference to FIGS. 1 through 4. In FIGS. 1 and 2, the parts identical to those shown in FIGS. 5 and 6 are designated by the same reference numerals as in these drawings with their description omitted.

Figure 5:
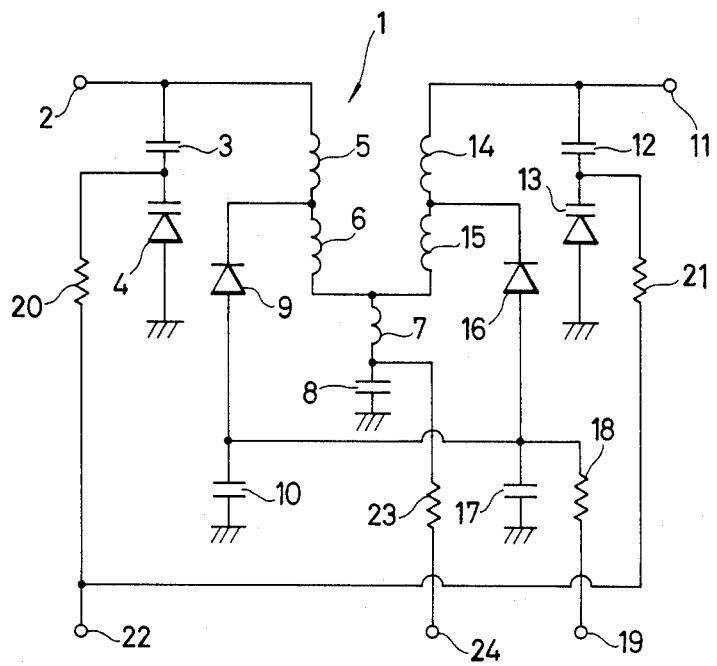
FIG. 5 is a circuit diagram showing an example of conventional double-tuned circuits.
Figure 6:
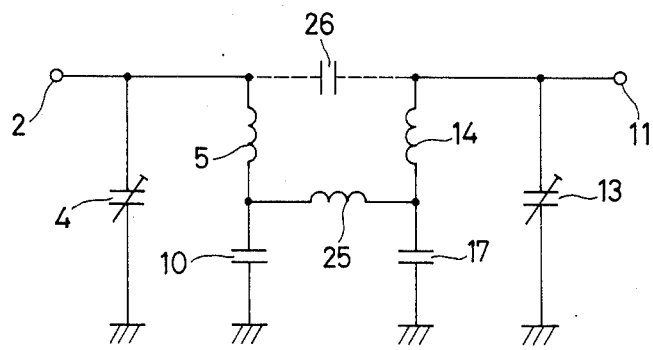
FIG. 6 is an equivalent circuit diagram corresponding to FIG. 5 at the time of reception of the highband.

The different point of a double-tuned circuit 30 according to the present invention shown in FIG. 1 from that of FIG. 5 is that a conductive wire 31 for connecting together the anodes of the first and second switching diodes 9 and 16 is wired so as to pass through a sintered magnetic material 32 of the form of a cylinder and effect inductive-coupling therewith.

Figure 3:
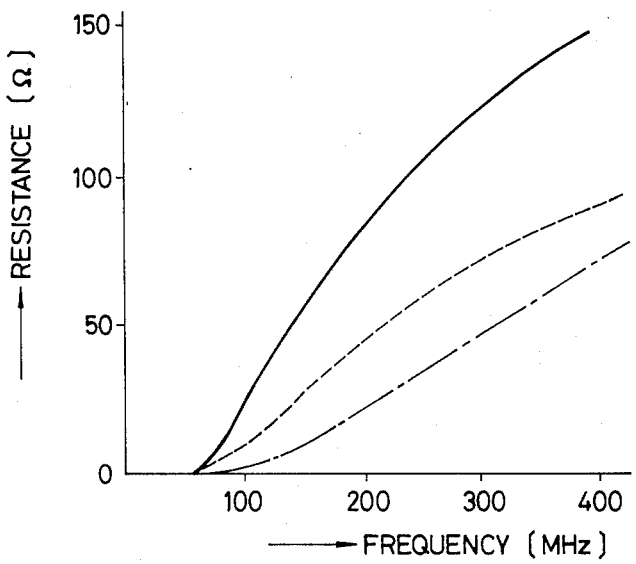
FIG. 3 is a graph showing a change of resistance of sintered magnetic materials with respect to a change of frequency.

According to the foregoing configuration, at the time of reception of the highband, as shown in the equivalent circuit diagram of FIG. 2, between the first and third resonance coils 5 and 14 are interposed in series an inductive component 33 of the conductive wire 31 and a resistance component 34 of the sintered magnetic material 32. As shown in FIG. 3, the resistance component 34 of the sintered magnetic material 32 increases with an increase of frequency. For reference, FIG. 3 shows the characteristics of different magnetic materials depicted by the solid line, broken line and one-dot chain line.

Figure 4:
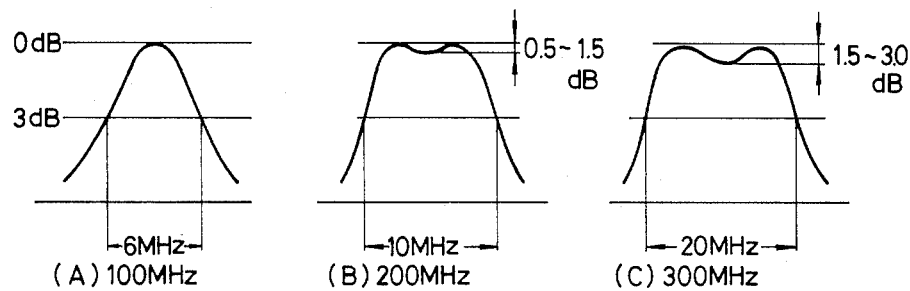
FIG. 4 is a diagram showing the bandwidth and the flatness of the passband characteristic of the double-tuned circuit of FIG. 1 in respective receive channels.
Figure 7:
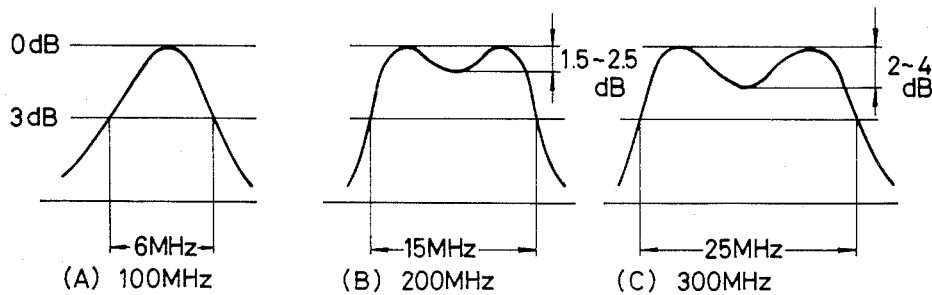
FIG. 7 is a diagram showing the bandwidth and the flatness of the passband characteristic of the double-tuned circuit of FIG. 5 in respective receive channels.

Therefore, with an increase of the receive channel frequency the resistance component 34 increases to act so as to lower the degree of coupling between the primary and secondary tuning circuits to thereby suppress an increase of the degree of coupling that would be caused by the inductive component 33. As a result, as shown in FIG. 4, the bandwidth of the double-tuned circuit 30 according to the present invention is limited to 6 MHz, 10 MHz, and 20 MHz in respective channels of 100 MHz, 200 MHz, and 300 MHz, whereby an increase of the bandwidth owing to an increase of the receive channel frequency can be suppressed in comparison with the conventional double-tuned circuit 1. Further, owing to the resistance component 34, the Q of the primary and secondary tuning circuits lowers, whereby the flatness of the passband characteristic can be improved. Of course, it is sufficient to dispose the conductive wire 31 so as to effect inductive-coupling with the sintered magnetic material 32, and the present invention should not be limited to the configuration of the foregoing embodiment.

As described above, according to the double-tuned circuit of the present invention, the resistance component of the sintered magnetic material increases with an increase of the receive channell frequency, and this increasing resistance component is interposed between the first and second switching diodes, thus, this interposition acts so as to lower the degree of coupling between the primary and secondary tuning circuits, whereby an increase of the degree of coupling owing to the inductive component of the conductive wire can be compensated, and both an enlargement of the bandwidth and degradation of the flatness of the passband characteristic which would be caused with an increase of the receive channel frequency can be suppressed. Consequently, there is produced the superior effect that the performance of the circuit is improved with respect to image disturbance, cross modulation disturbance, etc., the signal of the receive channel is output without being distorted, and the overall reception performance is enhanced.

What is claimed is:

1. A double-tuned circuit of the type comprising
   a primary tuning circuit including first and second resonance coils connected in series and a first switching diode interposed between the connection point of said first and second resonance coils and ground, and
   a secondary tuning circuit including third and fourth resonance coils connected in series and inductive-coupled with said first and second resonance coils, respectively, and a second switching diode interposed between the connection point of said third and fourth resonance coils and ground,
   wherein band switching is performed by turning on/off both said first and second switching diodes,
   characterized in that a bias voltage for turning on said first and second switching diodes is applied to one of said switching diodes and through a conductive wire inductive-coupled with a sintered magnetic material, having a resistance component which increases with frequency, to the other of said switching diodes.

2. A double-tuned circuit according to claim 1, wherein said sintered magnetic material has the shape of a cylinder and said conductive wire passes through said cylinder-like sintered magnetic material.

* * * * *

UNITED STATES PATENT AND TRADEMARK OFFICE
CERTIFICATE OF CORRECTION

PATENT NO. : 4,749,974

DATED : June 7, 1988

INVENTOR(S) : MASAKI YAMAMOTO, MINEO KOYAMA

It is certified that error appears in the above-identified patent and that said Letters Patent is hereby corrected as shown below: On the title page:

In the Abstract, line 15, delete "supplied" and insert --applied--.

Signed and Sealed this

Twenty-seventh Day of December, 1988

Attest:

DONALD J. QUIGG

*Attesting Officer*  *Commissioner of Patents and Trademarks*